United States Patent [19]

Fackler

[11] 4,387,346

[45] Jun. 7, 1983

[54] BIAS CIRCUIT FOR A MICROWAVE TRANSISTOR POWER AMPLIFIER

[76] Inventor: John D. Fackler, 172 Center St., Southport, Conn. 06490

[21] Appl. No.: 219,602

[22] Filed: Dec. 24, 1980

Related U.S. Application Data

[63] Continuation of Ser. No. 70,994, Aug. 30, 1979, abandoned.

[51] Int. Cl.³ .............................................. H03F 3/04
[52] U.S. Cl. .................................... 330/296; 330/289; 455/127
[58] Field of Search ....................... 330/289, 296, 297

[56] References Cited

U.S. PATENT DOCUMENTS

| | | | |
|---|---|---|---|
| 3,430,155 | 2/1969 | Harwood | 330/296 X |
| 3,896,394 | 7/1975 | Baro | 330/296 X |
| 3,999,140 | 12/1976 | Radovsky | 330/296 X |
| 4,027,271 | 5/1977 | Cave et al. | 330/296 |

OTHER PUBLICATIONS

"Low-noise V.H.F. Aerial Amplifier", *Elektor*, Jul.-/Aug., 1977, p. 24.

*Primary Examiner*—James B. Mullins
*Attorney, Agent, or Firm*—Costas, Montgomery & Dorman, P.C.

[57] ABSTRACT

A microwave frequency transmitter which operates at low source voltages and which obtains a microwave frequency carrier through frequency multiplication of relatively low frequencies. The transmitter further includes transistor amplifiers which operate from an unregulated, decreasing source voltage, but are base current regulated to provide an essentially constant power output regardless of decreasing source voltage with operational time.

6 Claims, 3 Drawing Figures

BIAS CIRCUIT FOR A MICROWAVE TRANSISTOR POWER AMPLIFIER

This is a continuation of application Ser. No. 070,994, filed Aug. 30, 1979, now abandoned.

This invention relates to transmitters operating in the microwave frequency range, and more particularly relates to such transmitters which are portable.

In the transmission of signals from a hand or shoulder carried video camera, the initial video picture scan is usually transmitted from a portable camera and transmitter to a relay station, which may be in an automotive van, and then retransmitted to a master station either for live broadcast or for recording for later broadcast. All of such transmissions are at microwave frequencies.

The video cameraman must carry not only the camera, but a microwave transmitter and a rechargeable battery or power pack. This presents a severe weight and volume problem to the cameraman.

Microwave frequency, 1000 mega Hertz (MHz) and above, oscillators require a high operating voltage, and microwave power amplifiers generally have higher rated operating voltages than are available from the portable power pack. This then requires the provision of a DC inverter, transformer, and attendant filters to provide the higher operating voltage. The weight of this equipment can be and often is burdensome to the cameraman and decreases his instant mobility.

The present invention provides a new and improved microwave frequency transmitter which obviates the necessity of high operating voltage and thus eliminates the requirement of the DC voltage conversion equipment. Additionally, the invention permits stable operation of microwave transistor amplifiers from an unregulated voltage source having a magnitude less than the rated operating voltages of the transistors, together with a lesser regulated voltage derived from the unregulated source.

Briefly stated, a transmitter embodying the invention comprises a first oscillator which furnishes a signal for frequency modulation of a video signal and a second oscillator whose output, which is well below the microwave frequency range, is mixed with frequency modulated signal to provide an intermediate frequency signal well below the microwave frequency range. A third local oscillator generates a low frequency signal which is frequency multiplied to provide a microwave frequency carrier for the IF signal. The power amplifiers receiving the modulated carrier are operated from the unregulated source voltage but are provided with regulation of base current to maintain the transistor base current constant with decrease in source voltage and thus maintains the average power output of each amplifier stage essentially constant.

An object of this invention is to provide a new and improved microwave frequency transmitter which operates directly from a portable voltage source.

Another object of this invention is to provide a transmitter of the type described where all frequencies are basically generated well below the microwave frequency range, thus requiring only a low operating voltage.

Another object of this invention is to provide a new and improved transistor amplifier which will provide stable operation when operated from an unregulated, decreasing source voltage which may be below the rated operating voltage of the amplifier.

The features of the invention which are believed to be novel are particularly pointed out and distinctly claimed in the concluding portion of this specification. However, the invention both as to its organization and operation together with further objects and advantages thereof may best be appreciated by reference to the following detailed description taken in conjunction with the drawings, in which:

Figure 1:
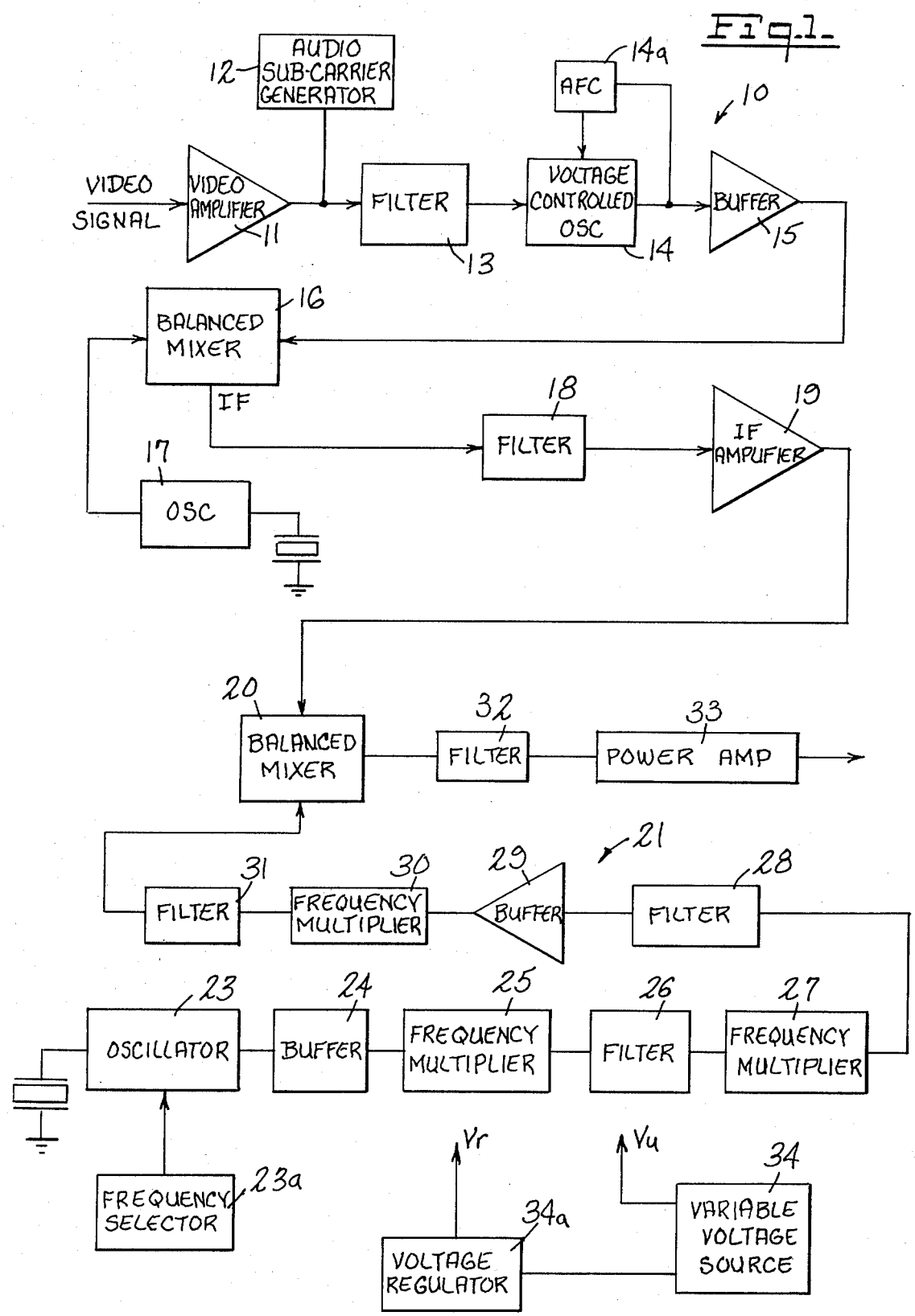
FIG. 1 is a block diagram of a transmitter embodying the invention.

A microwave frequency transmitter 10 embodying the invention with reference to FIG. 1 comprises a video amplifier 11 which receives a video input signal. This signal, together with an audio sub-carrier from generator 12 is passed through an appropriate low-pass filter 13 to a voltage controlled oscillator 14 which includes appropriate automatic frequency control (AFC) circuitry 15.

The voltage controlled oscillator 14 is the basic frequency modulated source of the transmitter. The output of oscillator 14 is coupled through a buffer amplifier 15 to a balanced mixer 16. Mixer 16 also receives an intermediate frequency from a first crystal controlled local oscillator 17. For purposes of example only, both oscillators 14 and 17 are well below the microwave frequency range which is generally considered to be 1,000 MHz. Oscillator 14, for example, will operate at 70 MHz while oscillator 17 operates at a frequency of 245 MHz. This local oscillator signal may be initially generated at one-half of that frequency and passed through a factor of two multiplier. The output of mixer 16 is passed through a filter 18 and the output thereof is applied to an intermediate frequency (IF) amplifier 19. A function of the intermediate amplifier 19 is to raise the signal level to provide sufficient drive for the next frequency conversion.

The output of IF amplifier 19 is applied to a balanced mixer 20 together with another local oscillator signal in the microwave range which is derived from a frequency generator 21. High frequency generator 21 comprises a crystal controlled oscillator 22 which by way of example may have a frequency range of 85 to 87 MHz and various intermediate frequencies or channels may be selected by a frequency selector 23. The output of oscillator 22 is passed through a buffer amplifier 24 to a frequency multiplier 25 where the frequency is raised by a factor of three. The frequency multiplied signal is then passed through a filter 26 to a second factor of three multiplier 27, and the resultant signal is again filtered by filter 28, passed through a buffer amplifier 29. The signal of oscillator 22 which has thus far been frequency multiplied by a factor of nine is again multiplied by a factor of three in multiplier 30, applied to a filter 31 and then mixed with the IF signal in mixer 20. The hetrodyned signal is then applied to a filter 32 and thereafter the signal is applied to driver and power amplifiers 22 as hereinafter described.

The system 10 operates only from an unregulated variable voltage $V_u$ source 34 which for example may range from 15.5 volts to 10.5 volts, and a regulated voltage $V_r$ of lesser value which for example may be eight volts derived from voltage regulator 33.

With this arrangement, microwave carrier frequencies are generated without requiring the usual high voltage source, and the usual DC inverter and attendant chopper, transformer, and filters are not required.

All oscillators, being well below the microwave frequency range, are operated from the low regulated voltage $V_r$.

Figure 2:
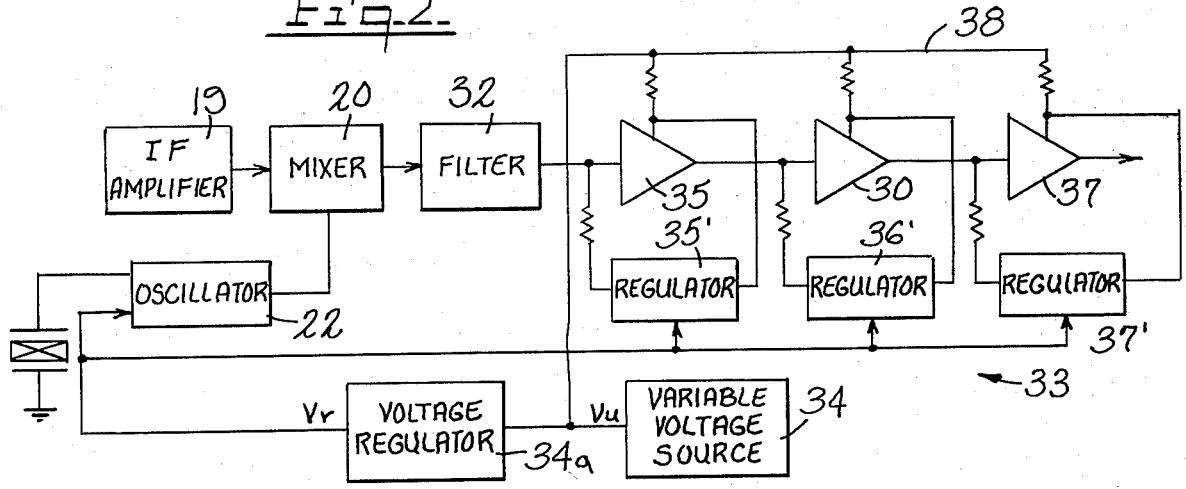
FIG. 2 is a diagram partially in block form and partially schematic of the power amplifier of FIG. 1.

Reference is now made to FIG. 2 for a description of the power amplifier 33. The variable voltage $V_u$ is applied to voltage regulator 34a which supplies a regulated voltage $V_r$ at a lesser value than the minimum voltage of the source; for example 8 volts. The unregulated variable voltage $V_u$ is also applied to a plurality of power amplifiers 35, 36, 37 over a line 38. Associated with each amplifier stage is a regulator 35', 36', 37', respectively, which act to maintain the DC base current of each power amplifier constant and thereby maintain constant current gain of the amplifier, as will hereinafter be explained.

Figure 3:
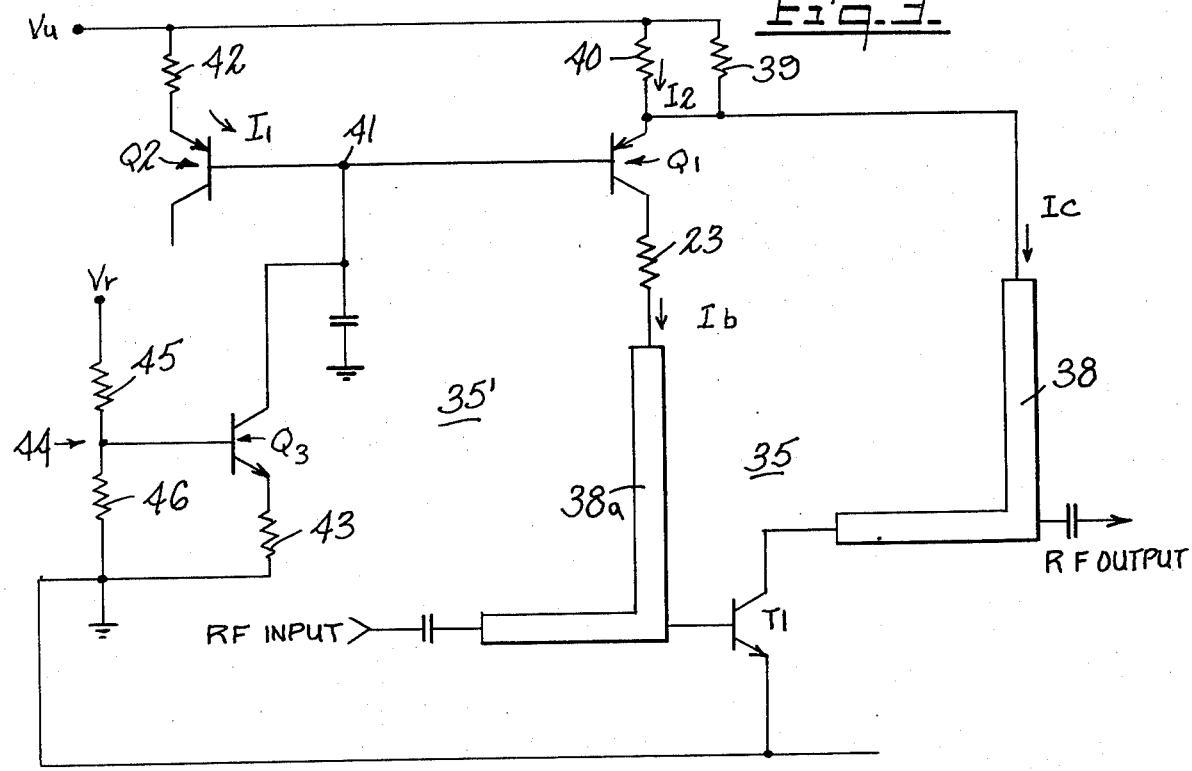
FIG. 3 is a schematic diagram of an amplifier stage of FIG. 2 together with its current regulator.

Reference is now made to FIG. 3 which illustrates a power amplifier 35 with regulator 35'. Each power amplifier stage comprises a microwave transistor T1 in a grounded emitter configuration. The collector of transistor T1 is connected through a microstrip 38 and a low value resistance 39 to the unregulated voltage $V_u$. The radio frequency (RF) output is taken at the collector while the input is through a portion of microstrip 38a to the base of T1. Resistance 39 is selected to set the operating current $I_c$ of transistor T1.

In conventional operation, if the collector voltage drops, there is a change of collector-base capacitance and this change in capacitance is reflected to the tank circuit resulting in a lower frequency. Additionally, the operation of the transistor will vary substantially with source voltage, particularly where the source voltage falls below the rated voltage of the transistor.

The present invention overcomes these problems by the provision of a regulator circuit 35' which maintains the DC base current $I_b$ of T1 essentially constant. Then, while the collector current varies as a function of the base input signal, the average output value is maintained by the regulator circuit.

A transistor Q1 shown as being of PNP type and having a collector resistance 23 connected between the unregulated voltage $V_u$ and the base of transistor T1 supplies DC base current $I_b$ to transistor T1. The emitter of transistor Q1 is connected to the unregulated voltage $V_u$ through a resistance 40. The base of transistor Q1 is connected to a point 41.

As will hereinafter be made apparent, transistor Q1 acts to regulate the base current $I_b$ to power amplifier transistor T1 as an inverse function of the supply voltage $V_u$, and maintain $I_b$ constant.

A transistor Q2 operated as an emitter-base diode is connected to $V_u$ through a resistance 42 and to the base of transistor Q1 at point 41. Transistor Q2 is of the same type as transistor Q1, for reasons hereinafter explained, but may be a straight diode dependent on junction-temperature characteristics. Transistor Q2 and resistance 42 act as a current sensor.

A transistor Q3 has its collector connected to point 41 and its emitter connected to ground through a resistance 43. Base bias is applied to transistor Q3 by regulated voltage $V_r$ across a voltage divider 44 comprising resistances 45 and 46. Voltage divider 44, together with the regulated voltage $V_r$, sets the base bias transistor Q3.

When the unregulated supply voltage $V_u$ does not change, the voltage at point 41 is constant, the current through transistor Q3 is constant and the base bias of transistor Q1 is constant. The bias at the base of transistor Q3 is selected to provide a low impedance reference for point 41 and the base of transistor Q1.

As the unregulated voltage $V_u$ decreases with operational time, the current through transistor Q3, a constant reference, decreases and the voltage at point 41 decreases. This lowers the positive bias on the base of transistor Q1, and decreases the effective resistance thereof as an inverse function of $V_u$. Thus the base current $I_b$ to power amplifier transistor T1 is maintained essentially constant. The collector current $I_c$ of transistor T1 varies as a function of the base signal, but since the average value of $I_b$ is maintained constant by the regulator circuit, the average current of each power stage is relatively unaffected by decrease in the supply voltage.

Transistor Q2 is the same as transistor Q1, while transistor Q3 is complimentary to Q1. Thus, all will have the same change in base-emitter voltage drop with temperature.

The currents $I_1$, and $I_2$, through transistors Q1 and Q2 are sampling currents responsive to $V_u$ and change with $V_u$. $I_1$ and $I_2$ will decrease at the same rate. With Q3 providing a reference impedance, the voltage at point 41 will decrease with $V_u$, thus decreasing the positive bias transistor Q1.

Transistor Q3 while serving to establish a low impedance reference also compensates for temperature variation. Being complimentary to transistors Q1 and Q2, transistor Q3 experiences the same change in emitter-base voltage drop with temperature. The base current of transistors Q1 and Q2 tend to decrease with temperature increase, but the change in emitter-base voltage of transistor Q3 will hold these base currents substantially constant despite temperature variation.

With the arrangement described, the DC base current $I_b$ to transistor T1 is maintained constant. The collector current $I_c$ of transistor T1 varies as a function of base signal, but the average $I_c$ is maintained by the regulator 35'.

The number of stages of power amplification may vary with application. In one application, four stages of power amplification having an output of 200 milliwatts provide a 26 dB power gain, and two succeeding stages having one watt output have a 7 dB power gain operating when operating at a frequency of 1.99 to 2.11 GHz.

In a particular embodiment of the invention designed to operate in the 1.990–2.110 GHz range, an amplifier and regulator as shown in FIG. 2 is constructed as follows:

| Transistor | Type |
|---|---|
| T1 | 57520 |
| Q1 | 2N3906 |
| Q2 | 2N3906 |
| Q3 | 2N3904 |
| Resistance | Value |
| 21 | 20 ohms |
| 23 | 330 ohms |
| 24 | 10 ohms |
| 26 | 22 ohms |
| 29 | 560 ohms |
| 30 | 1500 ohms |

$V_u = 15.5$ to $10.5$ volts
$V_r = 8.0 \pm 0.3$ volts.

A 57520 transistor is designed to operate from a 16–18 volt source.

The invention provides a new lightweight and compact microwave frequency transmitter which operates at voltages well below that normally required for microwave frequency generation. Additionally, the invention provides new and improved transistor amplifiers whose operation remains stable even though the source voltage is variable and may be below the rated operating voltage of the transistors.

It will thus be seen that the objects set forth above, among those made apparent from the preceding description, are efficiently attained and, since certain changes may be made in the above construction without departing from the spirit and scope of the invention, it is intended that all matter contained in the above description or shown in the accompanying drawings shall be interpreted as illustrative and not in a limiting sense.

What I claim is:

1. A microwave transistor power amplifier operated directly from an unregulated variable voltage source whose voltage decreases with operational time, said voltage source having a rated operating value less than the voltage of said transistor, said transistor having a collector-emitter circuit and a base circuit, the emitter of said transistor connected to ground, a low value resistance connecting the collector of said transistor directly to said voltage source,
   a current regulator connected between said voltage source and said base circuit to supply base current to said transistor,
   said current regulator including means for sensing decrease in said source voltage, and means responsive to said sensing means for maintaining the current through said regulator to the base of said transistor amplifier essentially constant whereby the average current through said transistor is relatively unaffected by decrease in the value of source voltage throughout the operational time of said voltage source.

2. The amplifier of claim 1 where said current regulator comprises a transistor having its collector-emitter circuit connected between said source and the base of said transistor amplifier, said sensing means varying the base bias current of said regulator transistor as a function of the source voltage.

3. The amplifier of claim 2 further including means establishing a bias on the base of said regulator transistor which varies with temperature the same as the emitter-base voltage drop of said regulator transistor.

4. The amplifier of claim 3 further comprising a voltage regulator responsive to said voltage source providing a regulated voltage less than the source voltage, said bias establishing means comprising a transistor complimentary to said regulator transistor, said bias establishing transistor receiving a constant base bias from the regulated voltage.

5. The amplifier of claim 4 wherein said sensing means comprises a resistance and a semi-conductor diode connected between said voltage source and the emitter-collector of said bias transistor, said diode having the same junction-voltage characteristics with temperature as the emitter-base of said regulator transistor.

6. A method of operating a microwave transistor power amplifier from an unregulated voltage source having a voltage value less than the rated operating voltage of the transistor where the source voltage decreases with operational time, comprising the steps of:
   connecting said transistor in a grounded emitter configuration,
   connecting the collector of said transistor to said source through a low value resistance,
   applying a radio frequency signal to the base of said transistor,
   applying a bias current to the base of said transistor as a function of a regulated voltage less than the source voltage,
   sensing the collector voltage of said transistor,
   regulating the base bias current to said transistor as an inverse function of the sensed collector voltage to maintain the average output current of said transistor relatively unaffected by decrease in source voltage.

* * * * *